United States Patent [19]

Orzikowski

[11] 4,268,837

[45] May 19, 1981

[54] INK JET RECORDING INSTRUMENT

[75] Inventor: Günter Orzikowski, Freiburg im Breisgau, Fed. Rep. of Germany

[73] Assignee: Hellige GmbH, Freiburg im Br., Fed. Rep. of Germany

[21] Appl. No.: 118,821

[22] Filed: Feb. 5, 1980

[30] Foreign Application Priority Data

Feb. 7, 1979 [DE] Fed. Rep. of Germany ....... 2904595

[51] Int. Cl.³ .............................................. G01D 15/18
[52] U.S. Cl. .................................. 346/75; 346/140 R
[58] Field of Search ............................. 346/75, 140 IJ

[56] References Cited

U.S. PATENT DOCUMENTS 2,566,443  9/1951  Elmgrist ................................ 346/75
4,100,550  7/1978  Elmgrist et al. ................... 346/75 X

*Primary Examiner*—George H. Miller, Jr.

[57] ABSTRACT

For improving the class of measuring quality of ink jet recorders the invention provides for a rigid connection of the permanent magnet of the electromagnetic driving system with the securing point of the capillary tube within the ink supply system by means of a torsion-resistant coupling element. It is suggested to place the securing point of said coupling element with said capillary tube as close as possible adjacent to the exit nozzle so that deviations of deflection of the exit nozzle by tumbling motions of the nozzle are prevented. The torsion-resistant coupling element transmits the instantaneous value of the exit nozzle deflection from the securing point to the measuring value detector of the control system of the ink jet recorder. Preferably, the coupling element is a length of a glass tube supported for rotation about its axis by two bearings placed upstream and downstream of the permanent magnet.

10 Claims, 1 Drawing Figure

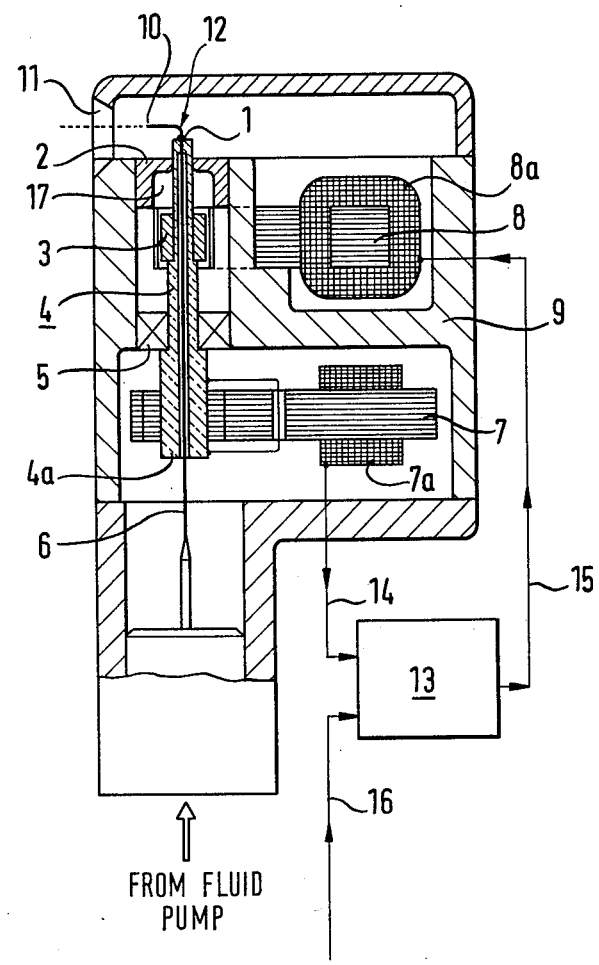

INK JET RECORDING INSTRUMENT

BACKGROUND OF THE INVENTION

1. Field of the Invention

The invention relates to an ink jet recording instrument in accordance with the preamble of claim 1.

As compared to recording instruments using lever arms, ink jet recording instruments for the analog recording of measuring magnitudes in the form of amplitude curves, such as in medical technology in connection with EEG and EKG devices, exhibit the advantage of a relative absence of mass inertia, so that frequencies up to 1200 Hertz can be recorded. Moreover, such ink jet recording instruments operate noiselessly and their range of amplitudes is not limited to a predetermined writing width, inasmuch as the recorded amplitude curves may overlap one another.

2. Description of the Prior Art

In German Pat. No. 821,065 there is disclosed an ink jet recording instrument in which the capillary tube serving for supplying and conveying the writing liquid, i.e. the ink, from a supply tank via a pump to the writing nozzle, is connected to a loop of silver wire by means of two parallel lengths of wire, whereby the silver wire loop is disposed within the magnetic field of a permanent magnet. The bent writing jet exit nozzle of the capillary tube is angularly displaced as a function of an electric current through the wire loop which current is controlled by the measuring magnitude to be recorded. This jet recording instrument, which has been known for a relatively long time, takes up too much space for most of the contemporary requirements because of the relatively large permanent magnet, as it is frequently desirable to generate a plurality of families of curves in a side-by-side arrangement along the same time axis, which requirement makes it necessary to mount several of such writing mechanisms one closely adjacent to another. This known liquid jet recording instrument is, furthermore, also quite complicated as far as its construction is concerned.

The published German Application No. 26 19 369 describes a liquid jet recording instrument of more contemporary construction, wherein a small, diametrically magnetized permanent magnet is comented to the capillary tube at a location ahead of its bent end which forms the exit nozzle for the writing liquid, with the permanent magnet being disposed between two pole shoes made of soft iron. The electromagnet with which the two pole shoes are connected has the shape of two tubelets which coaxially encompass the capillary tube, the energizing coil being disposed between the tubulets in order to achieve a space-saving arrangement. In this known arrangement, the permanent magnet, which is connected to the end of the capillary tube and disposed between the poles of the electromagnet, is mounted within a tube which is filled with a damping liquid, the tube being closed at either one of its ends by bearings for the capillary tube.

As compared to the first-mentioned type of liquid jet recording instruments, the second-mentioned recording instrument has the advantage that it can be produced as a compact structure, thus permitting the arrangement of a plurality of writing mechanisms mounted closely one to the other. There are, however, extremely strict requirements with respect to manufacturing tolerances and this is applicable not only to the step of mounting the capillary tube into the external tube which is provided with bearings, but this is also applicable to the step of cementing the permanent magnet to the capillary tube. The capillary tubes used in such jet recording instruments are extremely thin glass tubes whose external diameter falls within the order of magnitude of the diameter of a human hair. In order to guarantee the optimum of identical tolerances in connection with all recording mechanisms of a multiple recording instrument, very strict manufacturing tolerances not only apply to the step of pulling the capillary tubes, but also particularly to the step of cementing the permanent magnet to the bent end of the capillary tubes. A further disadvantage of basic importance, which prevails also in connection with liquid jet recording instruments in accordance with the first-mentioned German patent, resides in the fact that the capillary tube is not only used for conveying the recording liquid from a pump for the liquid, but also that the capillary tube, upon torsion, i.e. a twisting effect, applied to it, supplies the mechanical restoring force of the writing mechanism. As the capillary tube thus operates not only as the ink supply channel but also as the return spring, it determines, in association with a permanent magnet, in essence, the frequency limit, so that it is necessary that certain properties of the glass of the capillary tube are maintained constant along the entire length of the capillary tube. As a result, it becomes extremely difficult to adjust the driving system of the recording instrument.

In spite of these narrow manufacturing tolerances, only the measuring quality of class 2.5 can be achieved with such ink jet recording instruments, i.e. the recorded measuring values include errors, i.e. deviations, of 2.5% with respect to the final amplitude, i.e. the maximum amplitude. In contrast thereto, lever arm recording instruments permit achieving quality classes of 0.5 for example.

Disregarding the difficulties which result from the double function of the glass capillary tube, namely its function as an ink supply channel and as a restoring spring, an essential cause of the relatively unsatisfactory quality class resides in the fact that there is a substantial length of cantilevered writing nozzle which extends beyond the driving magnet, and therefore, the nozzle can not be well conducted or supported in the direction of the jet downstream from the permanent magnet, so that the bearing at the writing end of the capillary tube actually serves merely as a stop element for preventing wobbling motion of the writing nozzle. The thus resulting relatively great distance between the location of drive or rotation, which is determined by the position of the permanent magnet, and the location where the capillary tube is bent at right angle to form the exit nozzle is, therefore, an essential cause for the unsatisfactory lack of accuracy in connection with such known ink jet recording instruments.

OBJECT, SUMMARY and ADVANTAGES of the INVENTION

The invention, e.g. as defined in claim 1, has for its object to improve ink jet recording instruments in such a manner that, under reduced requirements for manufacturing tolerances and adjustment, an improved quality class of the writing mechanism can be achieved, as compared to what was possible heretofore.

Specifically, for this purpose, the capillary tube used for supplying the writing liquid from the conveying pump to the exit nozzle should be relieved from having to perform at least one of the other mechanical tasks which it still performed heretofore. These tasks which existed in the past are: supporting and positioning the exit nozzle; supporting the permanent magnet between the poles of the electromagnet; transferring the torque for angularly displacing the exit nozzle for the writing liquid from the permanent magnet to the end of the capillary tube which end of the tube is bent to form the exit nozzle; finally, supplying the restoring force by the torsion of the capillary tube against the torque applied by the permanent magnet.

The requirement for substantial mechanical relief of the supply capillary tube for the writing liquid constitutes one of the essential basic ideas of the present invention. One of the features which decisively contributes to meeting this requirements is the control of the achieved angular displacement of the capillary tube resulting from the torque transferred by the permanent magnet by means of a restoring mechanism. As is known, a restoring mechanism operates like a mechanical feedback by means of a control mechanism, wherein the actual value of the magnitude to be recorded—in the present instance the angular position of the end of the capillary tube—upon mechanical-electrical conversion, is compared with the desired value—in the present instance the amplitude of the measuring magnitude to be recorded—and wherein the magnitude to be controlled is corrected for the purpose of modification toward the desired value. The application of this control feature to an ink jet recording instrument in accordance with the teaching of the present invention leads to a substantial improvement within the meaning of the mentioned requirements, inasmuch as the special restoring force for the writing nozzle, which in the past had to be supplied by the torsion force of the capillary tube, is no longer required. Then, the angular position of the capillary tube is adjusted by the proposed restoring mechanism automatically as a function of the instantaneous value of the measuring magnitude to be recorded, so that, for example, the phenomenon of overshooting can be controlled and this is true in the positive sense and in the negative sense.

For the purpose of the restoring operation, the angular position or orientation can, in principle, be determined by pick-up devices known per se, and the angular position can be converted into an electrical magnitude which is supplied to the controller or control circuit for the necessary correction of the value to be controlled. Mechanical-electrical, optical-electrical, magnetic-electrical, inductive, ohmic, or capacitive transducers can be used. However, inductive mechanical-electrical transducers are particularly suitable for the purposes of the invention, such transducers having a cylindrical rotatable armature extending into a magnetic structure, as is known in principle.

In accordance with an advantageous embodiment of the control circuit for the restoring mechanism in accordance with the inventive concept of the invention, an electrical voltage which is supplied by the mechanical-electrical transducer and which is proportional to the sensed angular position of the capillary tube constitutes the actual or instantaneous value and is applied to one of the inputs of a differential amplifier, while the voltage, which is proportional to the amplitude of the measuring magnitude to be recorded, is applied to the other input as the desired value. The output from the amplifier then supplies the control signal in the form of an electrical current representing the difference between the actual value and the desired or set value, and constituting the control magnitude which is applied as the energizing current to the electromagnet of the driving motor for the permanent magnet. The torque applied to the permanent magnet becomes therefore smaller the smaller the erroneous angular displacement will be, which error is the difference between the instantaneous value and the set value. Therefore, there is no need for a special restoring force which would be the greater the greater will be the energizing current for the driving motor, as was necessary in connection with ink jet recording instruments known heretofore.

When using optical equipment for sensing the instantaneous value, a light source may cooperate with a photocell which is disposed at the opposite side with respect to the rotational axis of the capillary tube, so that the beam directed to the photocell is more or less blanked out, depending upon the angular orientation or position of the capillary tube.

The invention includes another feature suggested for the purpose of substantially solving the posed problems. This feature consists in the use of an additional torsion-resistant coupling element mounted between the permanent magnet of the rotational magnet mechanism and the capillary tube. Heretofore, the permanent magnet to which is applied a torque about the axis of the capillary tube as a function of energization of the magnet system was directly and immediately secured to the capillary tube itself. In accordance with the invention, however, the mentioned coupling element constitutes an intermediate link, preferably in the form of a hollow cylinder or a hollow shaft, cylindrically surrounding the centrally located capillary tube, thereby leaving a radial distance which permits mutual rotation of one part with respect to the other. This results in the following constructive advantages and improvements:

(a) The coupling element can directly grasp the capillary tube forming the channel for conveying the writing liquid to the exit nozzle at only a short distance from the bend and is secured to the capillary tube only at that location, so that it performs the functions of supporting and positioning the capillary.

(b) The permanent magnet used for transferring the torque to the capillary tube need not be secured immediately to the thin capillary tube but can now be secured to the external wall surface of the coupling element, which means at an increased radial distance from the axis of rotation, which feature reduces the mechanical load applied not only to the capillary tube but also applied to the location of juncture.

(c) The magnet system of the driving electromagnet, which has substantial space requirements, need not be disposed immediately at the end of the capillary tube which feature, in the past, was suitable to prevent wobbling motion of the end of the capillary tube, but rather the magnet system could be disposed at a greater distance from the exit nozzle of the capillary tube, so that a bearing for the coupling element can be mounted within the writing mechanism between the location where the coupling element is secured to the capillary tube and the location where the permanent magnet is secured to the coupling element, while a suitably provided second bearing may be mounted at the other side of the permanent magnet. Consequently, the coupling element grasps or holds the end of the capillary tube where it is bent to form the exit nozzle at a very short distance from the nozzle itself and thus permits accurate adjustment and prevents tumbling motion or wobbling motion of the end of the capillary tube.

(d) Additionally, the coupling element provides a protective shield for the capillary tube, particularly in the recommended embodiment as a hollow shaft, because it completely encompasses substantial sections thereof.

(e) The permanent magnet of the driving electromagnet is not disposed immediately close to, i.e. next to the axis of, the capillary tube, but is mounted at a relatively greater distance from the axis of the coupling element, so that the permanent magnet can be stronger than was the case heretofore, and so that the permanent magnet applies the forces over a longer lever arm. This increases the sensitivity without a requirement for stronger energizing currents, as compared to those in a liquid jet recording instrument known heretofore.

(f) A particularly great step forward in the art resides in the fact that the coupling element of the invention also assumes the function of the pick-up device for representing the angular momentaneous position of the capillary tube, as needed for the restoring mechanism in accordance with the invention. For this purpose, the end of the coupling element which is disposed at the other side, as viewed from the location of juncture with the capillary tube may, for example, be constructed to form the armature which is mounted between the poles of the magnetic system of an inductive mechanical-electrical transducer.

(g) The proposed implementation also leads to important progressive aspects from a production point of view, for example by eliminating the difficult application of a tiny permanent magnet to a capillary tube which is as thin as a hair. Rather, the previous extremely high requirements as far as manufacturing tolerances of the capillary tube are concerned no longer exist because the capillary tube performs, in essence, the sole function of an ink channel.

DETAILED DESCRIPTION OF THE PREFERRED EMBODIMENT

The invention and advantageous details thereof are explained below in conjunction and with reference to the drawing which illustrates an exemplary embodiment.

The sole FIGURE is a cross-sectional illustration of an essential portion of a liquid jet recording instrument, under omission of the pump for the ink.

Within a housing 9 of an ink jet recording instrument, there are mounted an electromagnet 8, to which the energization current is applied, and the angular position pick-up 7 constituting the measuring value transducer which is of an inductive nature in the illustrated embodiment. The writing liquid, i.e. the ink, is supplied from a liquid pump, not illustrated, through a filter and through the capillary tube 6 to an ink jet exit nozzle 10, in the form of the bent open end of the capillary tube, from which a very fine ink jet is sprayed upon a paper strip, which is movable with respect to the housing, through the exit opening 11 of the housing 9, which paper strip is not illustrated. Internally of the housing 9, the capillary tube 6 is surrounded by a hollow shaft 4 made of non-magnetic material, especially glass, the shaft 4 constituting the coupling element. Thus, a ring-shaped interspace remains, which permits mutual rotational displacement. This hollow shaft 4 is rotatably supported for rotation about the capillary tube at two locations, namely once ahead of the electromagnet 8 at the location 5, and also downstream from the electromagnet 8 closely adjacent to its end at the location 2, with the directions being defined with respect to the flow direction of the ink jet. The bearing at location 5 is preferably a small ball bearing. At the bearing location 2, also a ball bearing or, alternatively, a sliding bearing, particularly a jewel bearing, may be used. The hollow shaft 4 covers the capillary tube 6, actually immediately ahead of the bend 12 at which the capillary tube is bent to form the ink jet exit nozzle 10. At the forward end in immediate vicinity of the bent location 12, the hollow shaft 4 is secured to the capillary tube 6 ad 1, for example under use of cement. The intermediate length between the connection or coupling juncture 1 and the bend 12 is very short, so that wobbling motion or tumbling motion of the writing point between the jet exit opening and the juncture 1 are excluded. Suitably, the hollow shaft 4 has a wall thickness which is substantially greater than that of the capillary tube and, therefore, it is, for all practical purposes, prevented from torsional, i.e. twisting motion, as compared to the capillary tube. A small diametrically magnetized, not further identified magnet is disposed between the pole shoes of the electromagnet 8, suitably within a damping liquid, and the permanent magnet is firmly secured to the hollow shaft 4 at that location, for example by means of cement. When the winding 8a of the electromagnet 8 receives an energizing current, which, as described already above in principle, in the described embodiment of the invention is supplied as the control magnitude by the control amplifier 13, the permanent magnet 8 is correspondingly rotationally displaced and transfers the angular displacement via the rigid hollow shaft 4 to the juncture 1 and therewith immediately to the end of the capillary tube and therewith also to the ink jet exit nozzle 10.

The hollow shaft 4 assumes, furthermore, the important function of a transfer element of the restoring mechanism in accordance with the invention, inasmuch as it transfers the actual value of the angular position to the ink jet from the juncture 1 to the angular position pick-up 7, which, in the illustrated example, is constructed as an inductive pick-up device. The angular position pick-up 7 has its output applied to the controller 13 for the electrical energization current of the electromagnet 8, as described.

Advantageously, in connection with the implementation of the invention, the angular position pick-up 7 for the restoring mechanism may be mounted at a relatively great distance from the rotational magnet system 3, 8 and from the juncture 1 to the capillary tube 6, so that no difficulties are created with respect to accommodating the rotational magnetic system and the angular position pick-up within the housing 9. The described structural elements are advantageously disposed along the capillary tube in the following sequence between the point of connection to the liquid pump and the exit nozzle: First there is the angular position pick-up 7 with magnet poles, with the end of the coupling element 4 forming the armature 4a being inserted in the space between the magnet poles. Then follows a first rotational bearing 5 for the coupling element 4, subsequently the location where the rotating magnet 3 of the rotational magnet system 8 is mounted and, finally, as close as possible to the juncture 1 between the coupling element 4 and the capillary tube 6, there is a second bearing 2, which may also constitute a seal for the damping liquid, which liquid may fill the space between the two bearings in which space the rotational magnet swings back and forth.

The remaining control system for the energization current for the electromagnet 8, which is needed for the restoring operation, is shown schematically at 13, because circuits for such control systems are known per se. The control current generated in the winding 7a of transducer 7, which represents the actual value corresponding to angular orientation of the capillary tube, is applied to the controller 13 via line 14, where it is compared with an electrical magnitude which is proportional to the measuring signal to be recorded, which electrical magnitude is applied to the second input of the controller 13 via the line 16. As a result of this comparison, an electrical control signal is generated which is applied via line 15 to the control winding of the magnet system of the rotational magnet system 8, in such a sense that the deviation of the actual value of angular orientation from the desired value is reduced to zero by applying a corresponding torque to the permanent magnet 3. The preferred specific implementation has already been described above.

When constructing ink jet recording instruments in accordance with the invention, a significant improvement of the quality class with respect to recording accuracy is achieved. Moreover, the manufacturing difficulties are substantially reduced, as compared to previously employed manufacturing methods of the recording mechanism, particularly of the capillary tube constituting the writing liquid channel.

I claim:

1. An ink jet recording instrument having a capillary tube serving for feeding the writing liquid from a reservoir for the liquid to its bent end which constitutes the exit nozzle for the writing jet and including an electromagnetic driving system for exerting a torque upon the capillary tube which torque is a function of the magnitude of the measuring quantity to be recorded, characterized by a feed back control system for the angular position of the capillary tube comprising the following components:
   (a) a measuring value pick-up means (4) detecting the angular position of the capillary tube (6);
   (b) a mechanical-electric transducer (4a, 7) for converting the angular position into an electrical signal;
   (c) a control means to which said electrical signal representing the instantaneous value is supplied to be compared with an electrical value representing the set value of a signal to be recorded; said control means applying an energizing current as the regulated quantity to the energization circuit of the electromagnetic driving system (3, 8) for the capillary tube such that the angular position of the writing end (1) of the capillary tube (6) does not deviate from the set value which is proportional to the signal to be recorded.

2. The ink jet recording instrument of claim 1, wherein a permanent magnet (3), which transfers torques to the capillary tube (6) in response to the signals to be recorded and which is mounted between the poles of the electromagnet driving system (3, 8), is fixed to a torsion-resistant coupling element (4) which extends along the capillary (6) up to close to a point which is adjacent to the location (12) of the bend which forms the exit nozzle (10), the coupling element (4) having one of its ends secured to the capillary tube only at this location (1).

3. The ink jet recording instrument of claim 2, wherein the location (1) at which the coupling element (7) is secured to the capillary tube (6) is as close as possible to the location (12) at which the capillary tube (6) is bent to form the writing jet exit nozzle (10).

4. The ink jet recording instrument in accordance with claim 2 or 3, characterized in that the control means (13) comprises a control amplifier which compares the electrical signal representing the instantaneous value of the angular position of the capillary tube (6) with the electrical set value which is proportional to the amplitude of the signal to be recorded, and which generates, at its output, an energizing current for the magnet (8) of the electro-magnetic driving system (3, 8) constituting the control value which depends only from the determined deviation between the instantaneous value and the set value.

5. The ink jet recording instrument of claim 1 or claim 2, wherein the other end (4a) of the coupling element (4) constitutes the pick-up of the feed back system for sensing the angular position of the end of the capillary tube which is adjacent the nozzle.

6. The ink jet recording instrument of claim 5, wherein the end (4a) of the coupling element constitutes the rotational armature of an inductive mechanical-electrical transducer (7) which is disposed between the poles of its magnetic system.

7. The ink jet recording instrument of claim 6, wherein the coupling element is constituted by a hollow shaft or a hollow cylinder (4) which is rigid to resist torsion or twisting deformation, the coupling element performing the function of transferring the driving torque from the rotational magnet (3) to the end (1) of the capillary tube (6) adjacent the nozzle, as well as the function of an angular position pick-up for the mechanical-electrical transducer (7) of the feed back system.

8. The ink jet recording instrument of claim 7, wherein the hollow shaft (4) serving as a coupling element is made of non-magnetizable material, such as glass.

9. The ink jet recording instrument of claim 7, wherein the hollow shaft (4) is supported for rotation about its axis in a first bearing (2) between the location (1) where it is secured to the capillary tube (6) and the position of the permanent magnet (3) and that it is also supported in a second bearing (5) between the permanent magnet (3) and the other end (4a) of the hollow shaft (4) which constitutes the rotational armature for the mechanical-electrical transducer (7).

10. The ink jet recording instrument of claim 9, wherein an enclosed space (17) is provided between the two bearings (2 and 5) within the recording mechanism, the space being sealed between the bearings and accommodating a damping liquid for the angular orientation of the permanent magnet (3).

* * * * *